(12) United States Patent
Lee et al.

(10) Patent No.: US 7,674,696 B2
(45) Date of Patent: Mar. 9, 2010

(54) METHOD OF FABRICATING SEMICONDUCTOR DEVICE

(75) Inventors: Dong Ho Lee, Seongnam-si (KR); Kwon Hong, Seongnam-si (KR); Jae Mun Kim, Seoul (KR); Hee Soo Kim, Seongnam-si (KR); Jae Hyoung Koo, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 61 days.

(21) Appl. No.: 11/962,416

(22) Filed: Dec. 21, 2007

(65) Prior Publication Data

US 2008/0248637 A1    Oct. 9, 2008

(30) Foreign Application Priority Data

Apr. 6, 2007    (KR) ............... 10-2007-0034244

(51) Int. Cl.
*H01L 21/425* (2006.01)
(52) U.S. Cl. .................. 438/530; 438/479; 438/799; 257/E21.623; 257/E21.637
(58) Field of Classification Search ........... 438/799, 438/479, 592, 530; 257/E21.621, E21.623, 257/E21.637, E21.635
See application file for complete search history.

(56) References Cited

U.S. PATENT DOCUMENTS

| | | | |
|---|---|---|---|
| 6,872,639 B2 * | 3/2005 | DeBoer et al. | 438/506 |
| 2005/0136604 A1 * | 6/2005 | Al-Bayati et al. | 438/301 |
| 2006/0065849 A1 * | 3/2006 | Hwang et al. | 250/455.11 |
| 2008/0242039 A1 * | 10/2008 | Ku et al. | 438/305 |

FOREIGN PATENT DOCUMENTS

| | | |
|---|---|---|
| KR | 10-2002-0055886 | 7/2002 |
| KR | 10-2007-0020858 | 2/2007 |

\* cited by examiner

*Primary Examiner*—Caridad M Everhart
(74) *Attorney, Agent, or Firm*—Marshall, Gerstein & Borun LLP

(57) ABSTRACT

In one embodiment, a gate insulating layer, a conductive layer, and a metal layer are formed over a semiconductor substrate. An ion implantation region is formed in an interface of the conductive layer and the metal layer by performing an ion implantation process. A flash annealing process is performed on the ion-implanted semiconductor substrate. The metal layer, the conductive layer, and the gate insulating layer are patterned.

10 Claims, 5 Drawing Sheets

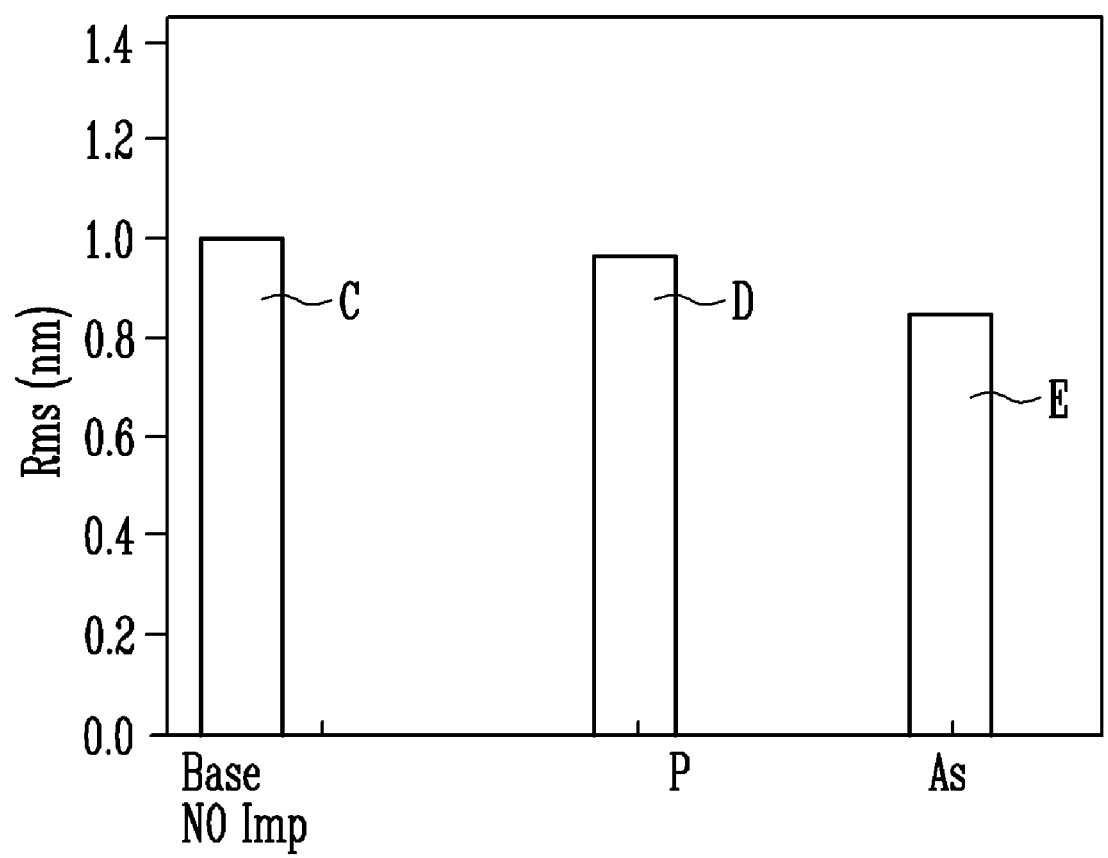

ated by reference in its entirety, is claimed.
METHOD OF FABRICATING SEMICONDUCTOR DEVICE

CROSS-REFERENCE TO RELATED APPLICATION

The priority of Korean patent application number 10-2007-34244, filed on Apr. 6, 2007, the disclosure of which is incorporated by reference in its entirety, is claimed.

BACKGROUND OF THE INVENTION

The invention relates generally to a method of fabricating a semiconductor device and, more particularly, to a method of fabricating a semiconductor device, wherein resistivity can be reduced by making uniform the root mean square (RMS) roughness resulting from the grain size of a metal layer at the interface between the metal layer and a conductive layer in forming a gate electrode layer having a stack structure.

In general, in semiconductor devices, a gate electrode has a stack structure of a conductive layer and a metal layer. The conductive layer is generally formed from polysilicon and the metal layer is generally formed from tungsten silicide (WSix). After the metal layer is formed, an annealing process is performed in order to reduce resistance of the metal layer and to improve the electrical properties of subsequently-formed word lines.

However, the annealing process is performed at high temperature, and the grain size of the metal layer therefore may become irregular. If the grain size of the metal layer becomes irregular, the RMS roughness of the interface of the metal layer and the conductive layer can be increased, so resistance may be increased and a gate patterning process may become difficult.

BRIEF SUMMARY OF THE INVENTION

The invention provides a method of fabricating semiconductor devices by performing an ion implantation process after a metal layer for forming a gate electrode is formed in order to improve the RMS roughness of the interface of the metal layer and a conductive layer, and by performing a flash annealing process in order to lower resistivity while prohibiting an increase of the RMS roughness.

In one embodiment, a method of fabricating a semiconductor device according to the invention comprises forming a gate insulating layer, a conductive layer, and a metal layer over a semiconductor substrate, forming an ion implantation region in an interface defined by the conductive layer and the metal layer by performing an ion implantation process, performing a flash annealing process on the ion-implanted semiconductor substrate, and patterning the metal layer, the conductive layer, and the gate insulating layer.

The ion implantation process is preferably performed using any one of phosphorus (P), arsenic (As), germanium (Ge), and silicon (Si) ions.

The ion implantation process is preferably performed by applying energy in the range of $1\times10^{14}$ ions/cm$^2$ to $1\times10^{16}$ ions/cm$^2$.

The flash annealing process is preferably performed using a xenon (Xe) flash lamp.

The method preferably further comprises performing a halogen annealing process on the semiconductor substrate after performing the flash annealing process.

A method of fabricating a semiconductor device according to another embodiment of the invention comprises forming a gate insulating layer, a conductive layer, and a metal layer over a semiconductor substrate, forming an ion implantation region in an interface defined by the conductive layer and the metal layer by performing an ion implantation process, performing a halogen annealing process on the ion-implanted semiconductor substrate, and patterning the metal layer, the conductive layer, and the gate insulating layer.

The halogen annealing process is preferably performed using a tungsten (W) halogen lamp.

The halogen annealing process is preferably performed using rapid thermal processing (RTP) in nitrogen (N$_2$) atmosphere.

DESCRIPTION OF SPECIFIC EMBODIMENTS

Specific embodiments according to the invention are described below with reference to the accompanying drawings.

However, the scope of the invention is not limited to the disclosed embodiments, but the invention be implemented in various manners. The embodiments are provided to complete the disclosure of the invention and to allow those having ordinary skill in the art to understand the scope of the invention. The scope of invention is defined by the claims.

FIGS. 1A to 1D are sectional views illustrating a method of fabricating a semiconductor device according to the invention.

Figure 1A:
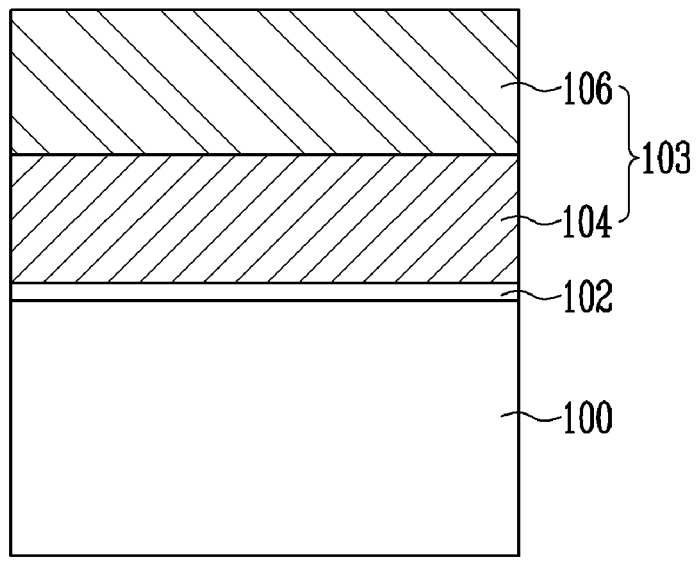
FIGS. 1A to 1D are sectional views illustrating a method of fabricating a semiconductor device according to the invention.

Referring to FIG. 1A, a gate insulating layer 102 and a gate electrode layer 103 are formed over a semiconductor substrate 100 in which an isolation layer (not shown) is formed. The gate insulating layer 102 is preferably formed from an oxide layer. The gate electrode 103 illustratively has a stack structure of a conductive layer 104 and a metal layer 106. The conductive layer 104 is preferably formed from polysilicon and the metal layer 104 is preferably formed from tungsten silicide (WSix).

Figure 1B:
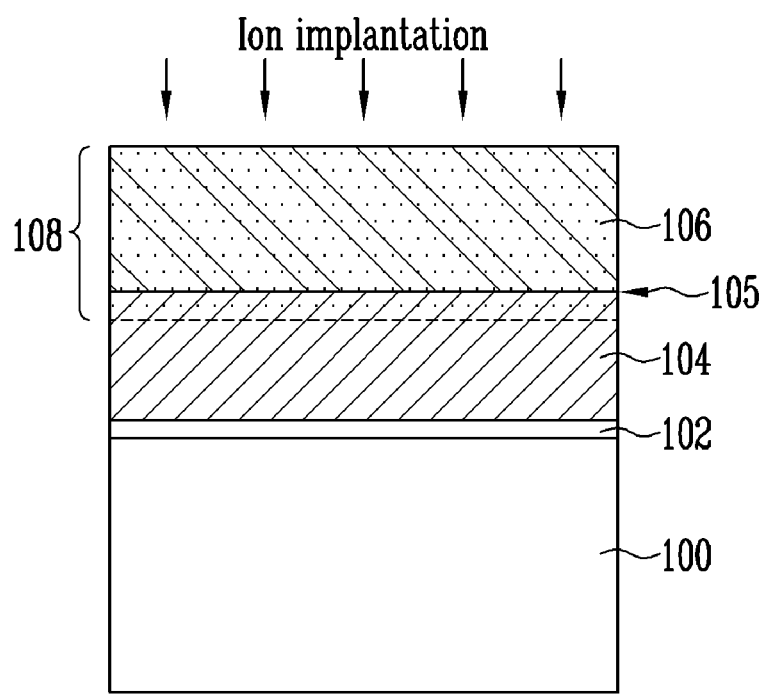

Referring to FIG. 1B, an ion implantation process is performed such that an interface 105 defined between the metal layer 106 and the conductive layer 104 is included in an ion implantation region 108. The ion implantation process is preferably performed using any one of phosphorus (P), arsenic (As), germanium (Ge), and silicon (Si) ions. Further, energy applied when the ion implantation process is performed may be controlled depending on a thickness and material of the gate electrode layer. The energy may be applied such that the ion implantation region 108 is included in the interface 105 of the metal layer 106 and the conductive layer 104. For example, the ion implantation process may be performed by applying energy in the range of $1\times10^{14}$ ions/cm$^2$ to $1\times10^{16}$ ions/cm$^2$.

Figure 1C:
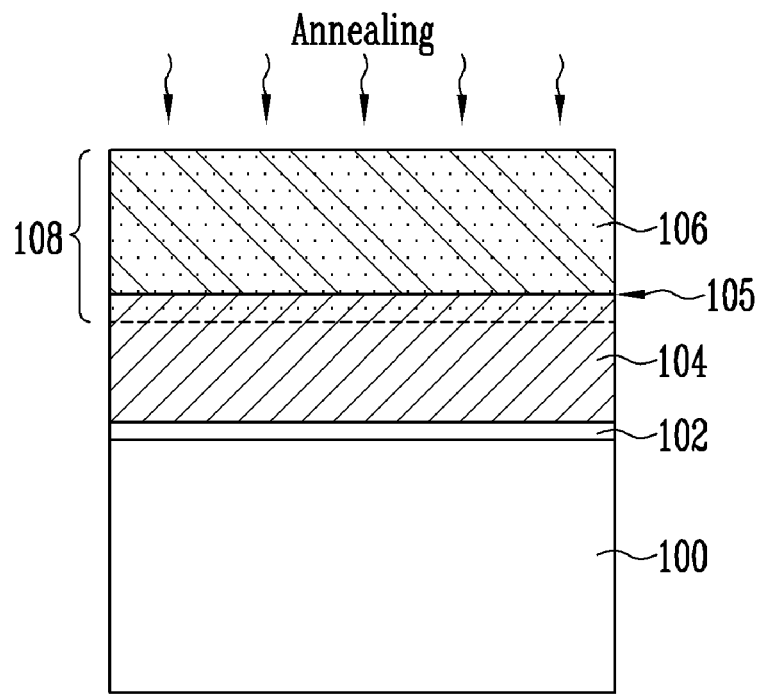

Referring to FIG. 1C, an annealing process is performed on the semiconductor substrate 100 over which the metal layer 106 is formed. If the annealing process is performed using a halogen lamp, it must be performed for a long time within a high-temperature annealing equipment. In this case, the grain size of the metal layer 106 can be increased. If the grain size is increased, the RMS grain size of the metal layer 106 at the interface 105 between the metal layer 106 and the conductive layer 104 can be undesirably increased.

To improve this problem, a flash annealing process for lowering resistance while maintaining the RMS roughness of the interface 105 between the conductive layer 104 and the metal layer 106 may be performed. The flash annealing process is preferably performed using a xenon (Xe) flash lamp.

The Xe flash lamp has a wavelength shorter than that of a tungsten (W) halogen lamp, and emits light that is easily absorbed by the gate electrode layer 103. Thus, if the Xe flash lamp is used, the annealing process can be performed relatively efficiently.

Figure 2:
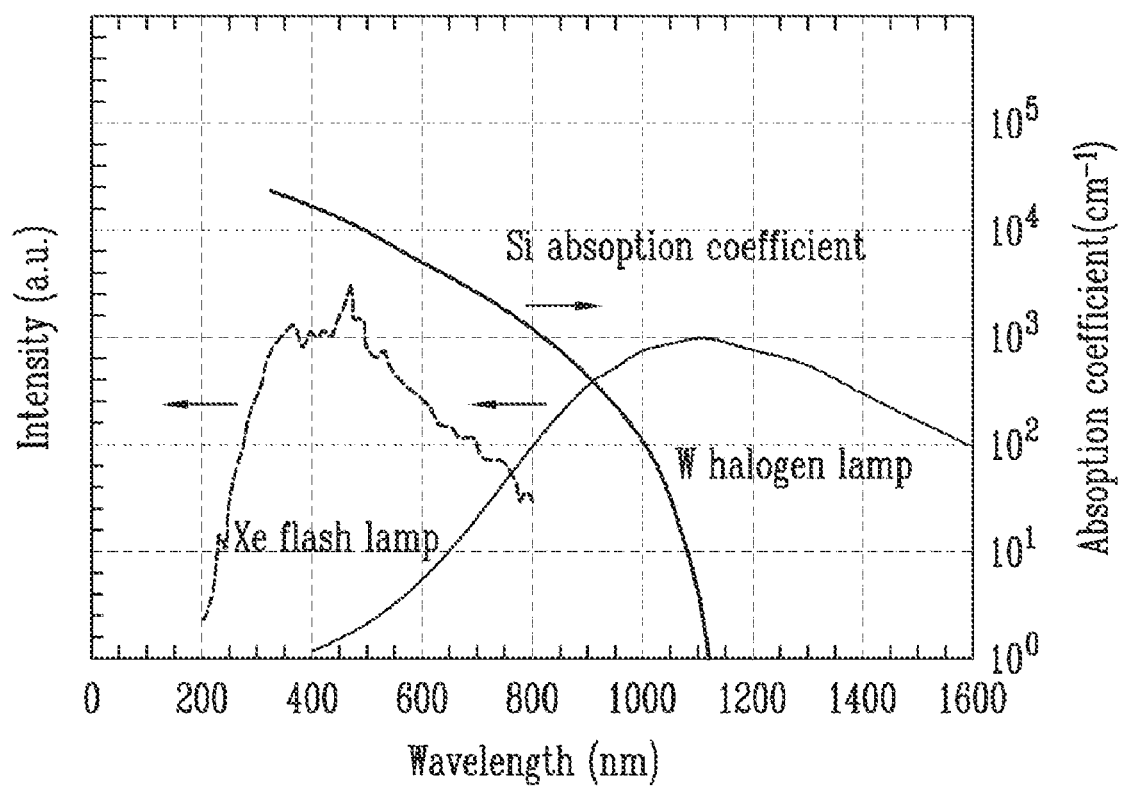
FIG. 2 is a graph illustrating the absorption coefficient depending on a lamp used in an annealing process.

This is better understood with reference to the graph of FIG. 2, which illustrates a comparison of Si absorption coefficients of emission light depending on the Xe flash lamp and the W halogen lamp with different wavelengths. In FIG. 2, the X axis indicates the wavelength, the Y axis on the left side of the graph indicates the intensity of the lamp, and the Y axis on the right side of the graph indicates the absorption coefficient. From the graph, it can be seen that a process using the Xe flash lamp has an absorption coefficient higher than that using the W halogen lamp. This is because the absorption coefficient toward the gate electrode layer is increased since the wavelength (200 nm to 800 nm) of the Xe flash lamp is relatively lower than that (400 nm or more) of the tungsten halogen lamp.

Further, an annealing process using the Xe flash lamp enables a short-term process on the order of milliseconds and therefore can shorten the turn around time (TAT) when compared with an annealing process using a conventional W halogen lamp. If the annealing process is performed for only a relatively short time, an increase of the grain size of the metal layer 106 can be prohibited and resistivity can be lowered. Due to this, an increase of the RMS roughness of the interface 105 between the metal layer 106 and the conductive layer 104 can be avoided.

After the annealing process using the flash lamp is performed, an annealing process for reducing resistivity may be performed. The additional annealing process is preferably performed using rapid thermal processing (RTP) by using the W halogen lamp in nitrogen ($N_2$) atmosphere in order to further lower resistivity without changing the concentration of the ion implantation region.

Figure 1D:
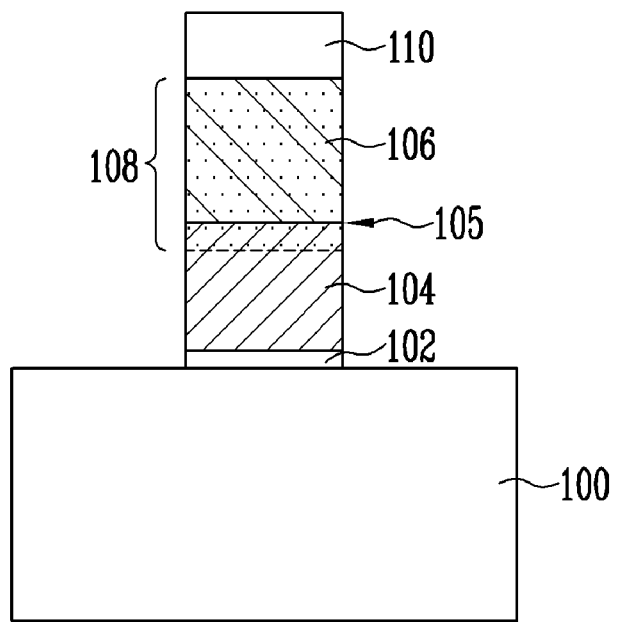

Referring to FIG. 1D, a hard mask film pattern 110 is formed on the metal layer 106. The metal layer 106, the conductive layer 104, and the gate insulating layer 102 are patterned by performing an etch process along the hard mask film pattern 110. At this time, the RMS roughness of the interface 105 and resistance of the gate electrode can be reduced by performing one or both of the ion implantation process and the flash annealing process.

Figure 3:
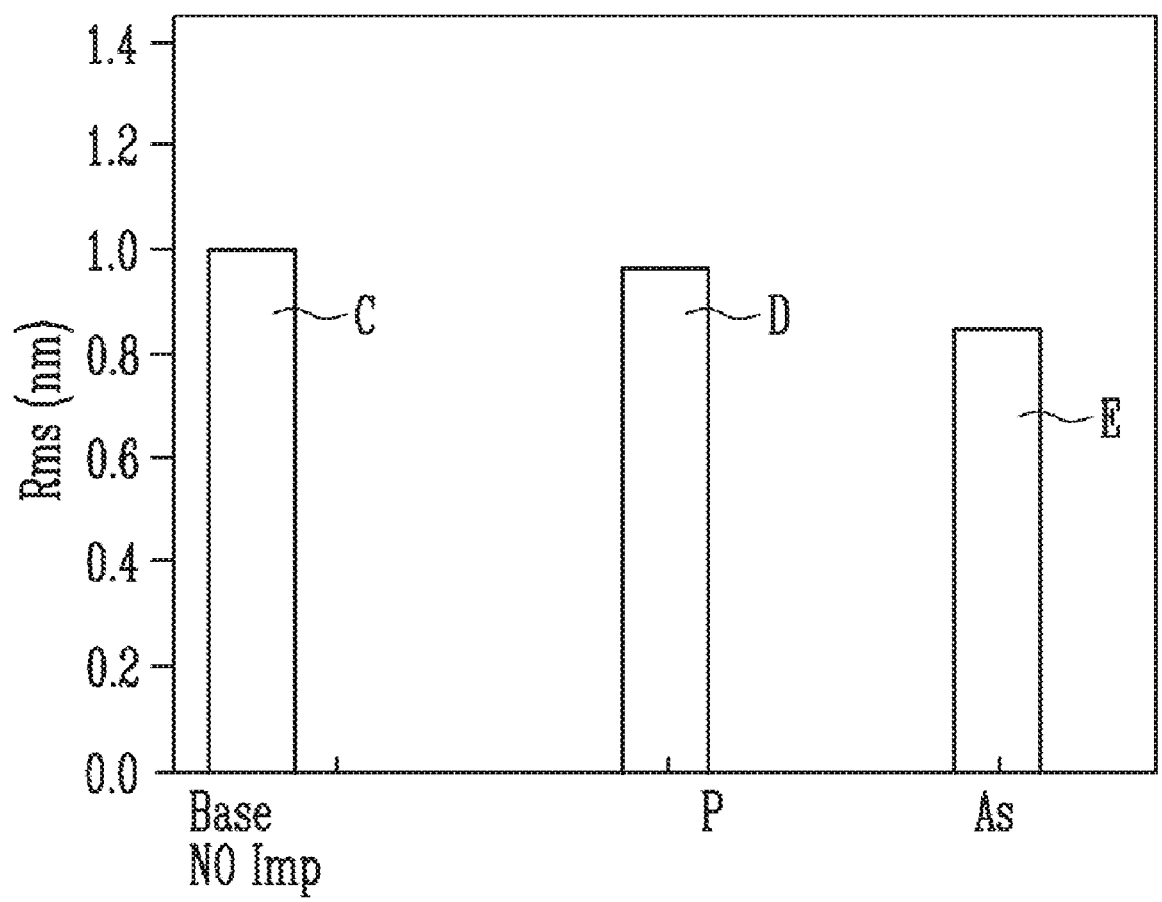
FIG. 3 is a graph illustrating comparison of the respective RMS grain sizes of metal layers according to the invention.

FIG. 3 is a graph illustrating a difference of the RMS roughness of the respective interfaces depending on the ion implantation process. In the graph, 'C' indicates the RMS roughness of an interface on which the annealing process was performed without performing the ion implantation process, and 'D' and 'E' indicate the RMS roughnesses of respective layers on which the ion implantation process was performed.

From FIG. 3, it can be seen that the RMS roughness at the interface of the layer C on which the annealing process was performed without ion implantation is the highest of the three, and the respective RMS roughnesses at the interface of the layers D and E into which an impurity P or As was implanted are relatively low. It can also be seen that the RMS roughness in a case where the ion implantation process was performed using arsenic (As) is much lower than that of a case where the ion implantation process was performed using phosphorous (P).

As described above, by performing the ion implantation process, the RMS roughness of the interface 105 between the metal layer 106 and the conductive layer 104 can be improved. Further, by performing the annealing process using the flash lamp, resistivity can be lowered while preventing an increase of the RMS roughness of the interface 105, and fabrication time can also be shortened.

As described above, according to the invention, after the gate electrode layer is formed, the ion implantation process is performed. Thus, the RMS roughness of the interface between the metal layer and the conductive layer can be improved. Further, resistivity can be lowered while avoiding an increase of the RMS roughness of the interface by performing the annealing process using the flash lamp. Accordingly, an increase of resistance of a gate electrode can be prevented and a gate patterning process can be easily performed.

What is claimed is:

1. A method of fabricating a semiconductor device, the method comprising:
   sequentially forming a gate insulating layer, a conductive layer, and a metal layer over a semiconductor substrate, with an interface defined between the conductive layer and the metal layer;
   forming an ion implantation region in the interface defined between the conductive layer and the metal layer by performing an ion implantation process to reduce the roughness of the interface;
   performing a flash annealing process on the resulting ion-implanted structure to lower resistivity while preventing an increase of the roughness of the interface; and
   patterning the metal layer, the conductive layer, and the gate insulating layer, thereby forming a gate electrode.

2. The method of claim 1, comprising performing the ion implantation process using any one of phosphorus (P), arsenic (As), germanium (Ge), and silicon (Si) ions.

3. The method of claim 1, comprising performing the ion implantation process by applying energy of $1\times10^{14}$ ions/cm$^2$ to $1\times10^{16}$ ions/cm$^2$.

4. The method of claim 1, comprising performing the flash annealing process using a xenon (Xe) flash lamp.

5. The method of claim 1, further comprising performing a halogen annealing process on the ion-implanted structure after performing the flash annealing process.

6. The method of claim 5, comprising performing the halogen annealing process using a tungsten (W) halogen lamp.

7. The method of claim 5, comprising performing the halogen annealing process using rapid thermal processing (RTP) in nitrogen ($N_2$) atmosphere.

8. A method of fabricating a semiconductor device, the method comprising:
   forming a gate insulating layer, a conductive layer, and a metal layer over a semiconductor substrate with an interface defined between the conductive layer and the metal layer;
   forming an ion implantation region in the interface of the conductive layer and the metal layer by performing an ion implantation process to reduce the roughness of the interface;
   performing a halogen annealing process on the resulting ion-implanted structure to lower resistivity while preventing an increase of the roughness of the interface; and
   patterning the metal layer, the conductive layer, and the gate insulating layer, thereby forming a gate electrode.

9. The method of claim 8, comprising performing the halogen annealing process using a tungsten (W) halogen lamp.

10. The method of claim 8, comprising performing the halogen annealing process using rapid thermal processing (RTP) in nitrogen ($N_2$) atmosphere.

* * * * *